US011239258B2

(12) United States Patent
Rui et al.

(10) Patent No.: US 11,239,258 B2
(45) Date of Patent: Feb. 1, 2022

(54) HIGH-K DIELECTRIC MATERIALS COMPRISING ZIRCONIUM OXIDE UTILIZED IN DISPLAY DEVICES

(71) Applicant: Applied Materials, Inc., Santa Clara, CA (US)

(72) Inventors: Xiangxin Rui, Campbell, CA (US); Lai Zhao, Campbell, CA (US); Jrjyan Jerry Chen, Campbell, CA (US); Soo Young Choi, Fremont, CA (US); Yujia Zhai, Fremont, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 15/773,640

(22) PCT Filed: Jul. 11, 2017

(86) PCT No.: PCT/US2017/041555
§ 371 (c)(1),
(2) Date: May 4, 2018

(87) PCT Pub. No.: WO2018/017360
PCT Pub. Date: Jan. 25, 2018

(65) Prior Publication Data
US 2020/0258918 A1 Aug. 13, 2020

Related U.S. Application Data

(60) Provisional application No. 62/364,145, filed on Jul. 19, 2016, provisional application No. 62/364,139, filed on Jul. 19, 2016.

(51) Int. Cl.
*H01L 27/12* (2006.01)
*H01L 29/24* (2006.01)
(Continued)

(52) U.S. Cl.
CPC ...... *H01L 27/1248* (2013.01); *H01L 27/1225* (2013.01); *H01L 27/1262* (2013.01);
(Continued)

(58) Field of Classification Search
None
See application file for complete search history.

(56) References Cited

U.S. PATENT DOCUMENTS 6,060,755 A * 5/2000 Ma ..................... H01L 29/513
257/410
6,713,846 B1 * 3/2004 Senzaki ............ H01L 21/28185
257/380
(Continued)

FOREIGN PATENT DOCUMENTS

| CN | 1387248 A | 12/2002 |
|---|---|---|
| KR | 10-0342316 B1 | 7/2002 |
| KR | 10-2002-0064624 A | 8/2002 |

OTHER PUBLICATIONS

"Low-Temperature Deposition of Zirconium Oxide Based Nanocrystalline Films by Alternate Supply of Zr[OC(CH3)3]4 and H2O" by Kukli et al. (Year: 2000).*

(Continued)

*Primary Examiner* — Evren Seven
(74) *Attorney, Agent, or Firm* — Patterson + Sheridan, LLP

(57) ABSTRACT

Embodiments of the disclosure generally provide methods of forming a capacitor layer or a gate insulating layer with high dielectric constant as well as low film current leakage and desired film qualities for display applications. In one embodiment, a thin film transistor structure includes a dielectric layer formed on a substrate, wherein the dielectric layer is a zirconium containing material comprising aluminum, and gate, source and drain electrodes formed on the (Continued)

substrate, wherein the gate, source and drain electrodes formed above or below the dielectric layer.

9 Claims, 10 Drawing Sheets

(51) Int. Cl.
 *H01L 29/66* (2006.01)
 *H01L 29/786* (2006.01)
(52) U.S. Cl.
 CPC ...... *H01L 29/247* (2013.01); *H01L 29/66969* (2013.01); *H01L 29/78693* (2013.01)

(56) References Cited

U.S. PATENT DOCUMENTS

| | | | |
|---|---|---|---|
| 6,844,604 B2 | 1/2005 | Lee et al. | |
| 7,902,018 B2* | 3/2011 | Kraus | H01L 29/518 438/216 |
| 8,766,251 B2* | 7/2014 | Kuegler | C23C 18/143 257/43 |
| 8,993,455 B2 | 3/2015 | Ahn et al. | |
| 2003/0042557 A1* | 3/2003 | Shimamoto | H01L 29/66545 257/406 |
| 2003/0116804 A1* | 6/2003 | Visokay | H01L 29/517 257/350 |
| 2004/0023461 A1* | 2/2004 | Ahn | H01L 21/28185 438/287 |
| 2004/0171280 A1* | 9/2004 | Conley, Jr. | H01L 29/66583 438/785 |
| 2005/0054165 A1* | 3/2005 | Ahn | H01L 21/02189 438/287 |
| 2005/0164479 A1* | 7/2005 | Perng | H01L 29/66583 438/591 |
| 2006/0125030 A1* | 6/2006 | Ahn | H01L 29/513 257/411 |
| 2006/0211195 A1* | 9/2006 | Luan | H01L 21/31645 438/240 |
| 2007/0059881 A1 | 3/2007 | Ahn et al. | |
| 2007/0287199 A1* | 12/2007 | Hsu | H01L 21/02046 438/3 |
| 2008/0182427 A1* | 7/2008 | Oberbeck | H01L 21/31641 438/785 |
| 2008/0258227 A1* | 10/2008 | Wang | H01L 21/823807 257/369 |
| 2009/0004881 A1* | 1/2009 | Chen | H01L 29/513 438/763 |
| 2010/0181563 A1 | 7/2010 | Kim et al. | |
| 2010/0320520 A1* | 12/2010 | Nakagawa | H01L 21/31604 257/300 |
| 2011/0031517 A1* | 2/2011 | Huang | H01L 29/78633 257/98 |
| 2011/0147858 A1* | 6/2011 | Lim | H01L 21/28008 257/412 |
| 2012/0077322 A1* | 3/2012 | Hirota | H01L 21/0228 438/381 |
| 2012/0235276 A1* | 9/2012 | Rui | H01L 21/02 257/532 |
| 2013/0056828 A1* | 3/2013 | Jeong | H01L 29/786 257/347 |
| 2013/0143384 A1 | 6/2013 | Malhotra et al. | |
| 2014/0080282 A1* | 3/2014 | Chiang | H01L 28/40 438/396 |
| 2014/0187015 A1* | 7/2014 | Rui | H01L 28/40 438/381 |
| 2015/0102344 A1* | 4/2015 | Song | H01L 29/4958 257/59 |
| 2015/0255490 A1* | 9/2015 | Miyairi | H01L 27/1207 257/43 |
| 2015/0349127 A1* | 12/2015 | Kurata | H01L 23/5226 257/43 |
| 2016/0104762 A1* | 4/2016 | Triyoso | H01L 27/0805 257/532 |
| 2016/0126344 A1* | 5/2016 | Ellinger | H01L 29/786 257/66 |
| 2016/0276488 A1* | 9/2016 | Yamazaki | H01L 27/1225 |
| 2016/0336349 A1* | 11/2016 | Wang | H01L 29/4908 |
| 2018/0033893 A1* | 2/2018 | Lee | C23C 14/185 |
| 2020/0411658 A1* | 12/2020 | Yamazaki | H01L 21/8239 |

OTHER PUBLICATIONS

"Solution-processed indium-zinc-oxide thin-film transistors based on anodized aluminum oxide gate insulator modified with zirconium oxide" by Li et al. (Year: 2015).*
"Si-Doped Aluminates for High Temperature Metal-Gate CMOS: Zr—Al—Si—0, A Novel Gate Dielectric for Low Power Applications" by Manchanda (Year: 2000).*
"Zirconium Oxide Based Gate Dielectrics with Equivalent Oxide Thickness of Less Than 1.0 nm and Performance of Submicron MOSFET using a Nitride Gate Replacement Process" by Ma et al. (Year: 1999).*
Office Action for Korean Application No. 10-2018-7033148 dated Feb. 14, 2020, 7 pages.
International Search Report and Written Opinion dated Oct. 19, 2017 for Application No. PCT/US2017/041555.
Office Action from Taiwanese Patent Application No. 106123346 dated Nov. 24, 2020.
Office Action from Chinese Application No. 201780026052.8 dated Mar. 11, 2021.
Office Action from Taiwanese Patent Application No. 106123346 dated Jul. 26, 2021.

* cited by examiner

HIGH-K DIELECTRIC MATERIALS COMPRISING ZIRCONIUM OXIDE UTILIZED IN DISPLAY DEVICES

BACKGROUND

Field

Embodiments of the present disclosure generally relate to forming a dielectric layer having a high dielectric constant for display devices. More particularly, embodiments of the disclosure relate to methods for forming a high dielectric constant film layer comprising zirconium oxide by an atomic layer deposition (ALD) process for display applications.

Description of the Related Art

Display devices have been widely used for a wide range of electronic applications, such as TV, monitors, mobile phone, MP3 players, e-book readers, personal digital assistants (PDAs) and the like. The display device is generally designed for producing a desired image by applying an electric field to a liquid crystal that fills a gap between two substrates (e.g., a pixel electrode and a common electrode) and has anisotropic dielectric constant that controls the intensity of the dielectric field. By adjusting the amount of light transmitted through the substrates, the light and image intensity, quality and power consumption may be efficiently controlled.

A variety of different display devices, such as active matrix liquid crystal display (AMLCD) or an active matrix organic light emitting diode (AMOLED), may be employed as light sources for display. In the manufacturing of display devices, an electronic device with high electron mobility, low leakage current and high breakdown voltage, would allow more pixel area for light transmission and integration of circuitry, thereby resulting in a brighter display, higher overall electrical efficiency, faster response time and higher resolution displays. Low film qualities of the material layers, such as dielectric layers with impurities or low film densities, formed in the device often result in poor device electrical performance and short service life of the devices. Thus, a stable and reliable method for forming and integrating film layers within TFT and OLED devices becomes crucial to providing a device structure with low film leakage, and high breakdown voltage for use in manufacturing electronic devices with lower threshold voltage shift and improved overall performance of the electronic device.

In particular, the interface management between a metal electrode layer and the nearby insulating materials becomes critical as improper material selection of the interface between the metal electrode layer and the nearby insulating material may adversely result in undesired elements diffusing into the adjacent materials, which may eventually lead to current short, current leakage or device failure. Furthermore, the insulating materials with different higher dielectric constants often provide different electrical performance, such as providing different capacitance in the device structures. Selection of the material of the insulating materials not only affects the electrical performance of the device, incompatibility of the material of the insulating materials to the electrodes may also result in film structure peeling, poor interface adhesion, or interface material diffusion, which may eventually lead to device failure and low product yield.

In some devices, capacitors, e.g., a dielectric layer placed between two electrodes, are often utilized and formed to store electric charges when the display devices are in operation. The capacitor as formed is required to have high capacitance for display devices. The capacitance may be adjusted by changing of the dielectric material and dimension of the dielectric layer formed between the electrodes and/or thickness of the dielectric layer. For example, when the dielectric layer is replaced with a material having a higher dielectric constant, the capacitance of the capacitor will increase as well. As the resolution requirement for display devices is increasingly challenging, e.g., display resolution greater than 800 ppi, only limited areas remain in the display devices to allow forming capacitors therein to increase electrical performance. Thus, maintaining the capacitor formed in the display devices in a confined location with a relatively small area has become crucial.

Therefore, there is a need for improved methods for forming a dielectric layer with a high dielectric constant with desired film qualities and low leakage for manufacturing display devices that produce improved device electrical performance.

SUMMARY

Embodiments of the disclosure generally provide methods of forming a dielectric layer with a high dielectric constant as well as desired film qualities and low film leakage by an atomic layer deposition process for display applications. In one embodiment, a thin film transistor structure includes a dielectric layer formed on a substrate, wherein the dielectric layer is a zirconium containing material comprising aluminum, and gate, source and drain electrodes formed on the substrate, wherein the gate, source and drain electrodes are formed above or below the dielectric layer.

In another embodiment, a method for forming a composite film layer for display devices includes performing an ALD process to form a composite film layer comprising a first layer and a second layer disposed on a substrate, the first layer comprises doped aluminum zirconium containing layer formed on the substrate and the second layer comprises zirconium containing layer.

In yet another embodiment, a device structure utilized in a display device includes a capacitor structure having a capacitor layer formed between two electrodes in a display device, wherein the capacitor layer is an aluminum doped $ZrO_2$ layer having an amorphous structure with a dielectric constant between about 15 and about 25.

BRIEF DESCRIPTION OF THE DRAWINGS

So that the manner in which the above recited features of the present disclosure are attained and can be understood in detail, a more particular description of the disclosure, briefly summarized above, may be had by reference to the embodiments thereof which are illustrated in the appended drawings.

To facilitate understanding, identical reference numerals have been used, where possible, to designate identical elements that are common to the figures. It is contemplated that elements and features of one embodiment may be beneficially incorporated in other embodiments without further recitation.

Figure 1:
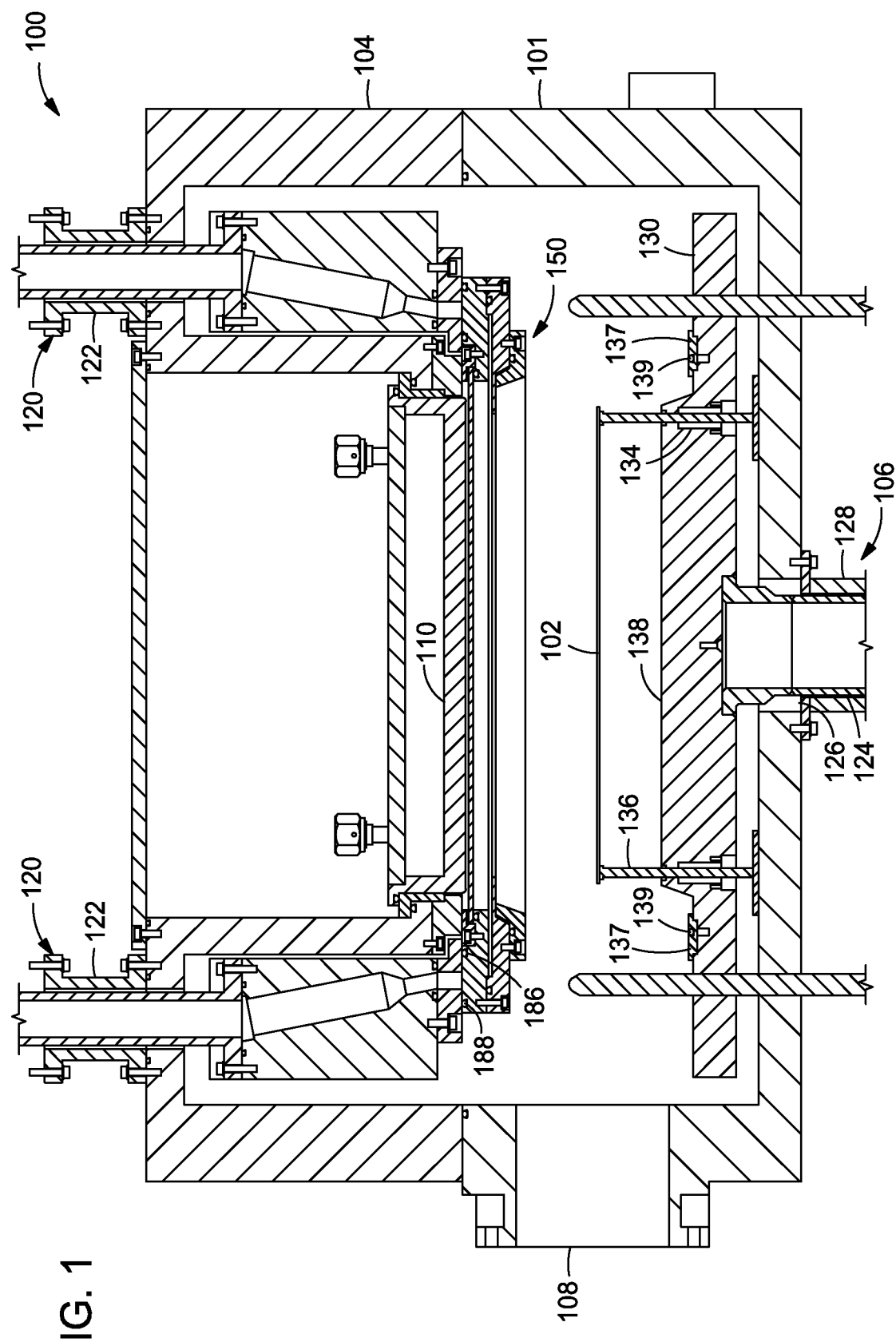
FIG. 1 depicts a sectional view of a processing chamber that may be used to deposit a high dielectric constant dielectric layer in accordance with one embodiment of the present disclosure.

It is to be noted, however, that the appended drawings illustrate only exemplary embodiments of this disclosure and are therefore not to be considered limiting of its scope, for the disclosure may admit to other equally effective embodiments.

DETAILED DESCRIPTION

Embodiments of the disclosure generally provide methods of forming a high dielectric constant film layer with enhanced electrical performance, such as high capacitance and low leakage for display devices. Such high dielectric constant film layer (e.g., dielectric constant greater than 10) may be formed as a capacitor or any suitable structures in display devices. The dielectric layer may be manufactured by an atomic layer deposition (ALD) process that may provide a film layer with low defect density, low impurities, low film leakage and high dielectric constant. The high dielectric constant film layer formed by the ALD process may be utilized in any insulating structure and/or capacitor structures in TFT devices or OLED devices. In one example, the high dielectric constant film layer comprises zirconium containing material, such as zirconium oxide ($ZrO_2$), with a dielectric constant greater than 10, such as at least between about 15 and 45, such as between about 15 and 25. The zirconium containing material in the high dielectric constant film layer may further include dopants to render the high dielectric constant film layer as an amorphous structure. One exemplary dopant may be an aluminum containing dopant. The zirconium containing material comprising aluminum dopant may have a dielectric constant at a relative low range (e.g., between about 15 and 25) while maintaining low film leakage. The zirconium containing material comprising aluminum dopant may be used in any suitable layers, such as a gate insulating layer, a capacitor layer formed between two electrodes, an inter-insulating layer, an etching stop layer or an interface protection layer in display devices for electric performance enhancement and improvement.

In some examples, the zirconium containing material as described in this disclosure may be exchanged or replaced with hafnium (Hf) containing material, including hafnium oxide, doped hafnium, doped hafnium oxide or the like. In some other examples, the zirconium containing material as described in this disclosure may be exchanged or replaced with aluminum (Al) containing material, including aluminum oxide, doped aluminum, doped aluminum oxide or the like.

Some other embodiments of the disclosure provide methods of forming a composite film layer having a high dielectric constant with enhanced electrical performance, such as high capacitance and low leakage for display devices. Such high dielectric constant composite film layer (e.g., dielectric constant greater than 10 and/or 25) may be formed as a capacitor or any suitable structures in display devices. The composite film layer with high dielectric constant may be manufactured by an atomic layer deposition (ALD) process that may provide a film layer with low defect density, low impurities, low film leakage and high dielectric constant. The composite film layer with high dielectric constant formed by the ALD process may be utilized in any insulating structure and/or capacitor structures in TFT devices or OLED devices. In one example, the composite film layer with high dielectric constant comprises a first portion of the film layer with zirconium containing material, such as zirconium oxide ($ZrO_2$), in cubic, tetragonal structures or mix of cubic and tetragonal structures, providing the composite film layer with high dielectric constant greater than 25. The composite film layer with high dielectric constant further comprises a second portion of the film layer with zirconium containing material including dopants so as to render the zirconium containing material as an amorphous structure, providing the doped the zirconium containing material with a dielectric constant greater than 10 with low film leakage. One exemplary dopant may be an aluminum containing dopant. The composite film layer with high dielectric constant may be used in any suitable layers, such as a gate insulating layer, a capacitor layer formed between two electrodes, an inter-insulating layer, an etching stop layer or an interface protection layer in display devices for electric performance enhancement and improvement.

FIG. 1 is a schematic cross sectional view of an ALD (atomic layer deposition) chamber 100 that may be used to perform a deposition described herein. It is contemplated that other deposition systems may be alternatively utilized. The ALD deposition process may be utilized to form a dielectric layer, such as an insulating layer, a gate insulating layer, an etch stop layer, an interlayer insulator, a dielectric layer for capacitor or passivation layer in display devices as described herein. The chamber 100 generally includes a chamber body 101, a lid assembly 104, a substrate support assembly 106, and a process kit 150. The lid assembly 104 is disposed on the chamber body 101, and the substrate support assembly 106 is at least partially disposed within the chamber body 101. The chamber body 101 includes a slit valve opening 108 formed in a sidewall thereof to provide access to the interior of the processing chamber 100. In some embodiments, the chamber body 101 includes one or more apertures that are in fluid communication with a vacuum system (e.g., a vacuum pump). The apertures provide an egress for gases within the chamber 100. The vacuum system is controlled by a process controller to maintain a pressure within the processing chamber 100 suitable for ALD processes. The lid assembly 104 may include one or more differential pumps and purge assemblies 120. The differential pump and purge assemblies 120 are mounted to the lid assembly 104 with bellows 122. The bellows 122 allow the pump and purge assemblies 120 to move vertically with respect to the lid assembly 104 while still maintaining a seal against gas leaks. When the process kit 150 is raised into a processing position, a compliant first seal 186 and a compliant second seal 188 on the process kit 150 are brought into contact with the differential pump and purge assemblies 120. The differential pump and purge assemblies 120 are connected with a vacuum system (not shown) and maintained at a low pressure.

As shown in FIG. 1, the lid assembly 104 includes a RF cathode 110 that can generate a plasma of reactive species within the chamber 100 and/or within the process kit 150. The RF cathode 110 may be heated by electric heating elements (not shown), for example, and cooled by circulation of cooling fluids, for example. Any power source capable of activating the gases into reactive species and maintaining the plasma of reactive species may be used. For example, RF or microwave (MW) based power discharge techniques may be used. The activation may also be generated by a thermally based technique, a gas breakdown technique, a high intensity light source (e.g., UV energy), or exposure to an x-ray source.

The substrate support assembly 106 can be at least partially disposed within the chamber body 101. The substrate support assembly 106 can include a substrate support member or susceptor 130 to support a substrate 102 for processing within the chamber body. The susceptor 130 may be coupled to a substrate lift mechanism (not shown) through a shaft 124 or shafts 124 which extend through one or more openings 126 formed in a bottom surface of the chamber body 101. The substrate lift mechanism can be flexibly sealed to the chamber body 101 by a bellows 128 that prevents vacuum leakage from around the shafts 124. The substrate lift mechanism allows the susceptor 130 to be moved vertically within the ALD chamber 100 between a lower robot entry position, as shown, and processing, process kit transfer, and substrate transfer positions. In some embodiments, the substrate lift mechanism moves between fewer positions than those described.

In some embodiments, the substrate 102 may be secured to the susceptor using a vacuum chuck (not shown), an electrostatic chuck (not shown), or a mechanical clamp (not shown). The temperature of the susceptor 130 may be controlled (by, e.g., a process controller) during processing in the ALD chamber 100 to influence temperature of the substrate 102 and the process kit 150 to improve performance of the ALD processing. The susceptor 130 may be heated by, for example, electric heating elements (not shown) within the susceptor 130. The temperature of the susceptor 130 may be determined by pyrometers (not shown) in the chamber 100, for example.

As shown in FIG. 1, the susceptor 130 can include one or more bores 134 through the susceptor 130 to accommodate one or more lift pins 136. Each lift pin 136 is mounted so that the lift pin 136 may slide freely within a bore 134. The support assembly 106 is movable such that the upper surface of the lift pins 136 can be located above the substrate support surface 138 of the susceptor 130 when the support assembly 106 is in a lower position. Conversely, the upper surface of the lift pins 136 is located below the substrate support surface 138 of the susceptor 130 when the support assembly 106 is in a raised position. When contacting the chamber body 101, the lift pins 136 push against a lower surface of the substrate 102, lifting the substrate off the susceptor 130. Conversely, the susceptor 130 may raise the substrate 102 off of the lift pins 136.

In some embodiments, the susceptor 130 includes process kit insulation buttons 137 that may include one or more compliant seals 139. The process kit insulation buttons 137 may be used to carry the process kit 150 on the susceptor 130. The one or more compliant seals 139 in the process kit insulation buttons 137 are compressed when the susceptor lifts the process kit 150 into the processing position.

Figure 2:
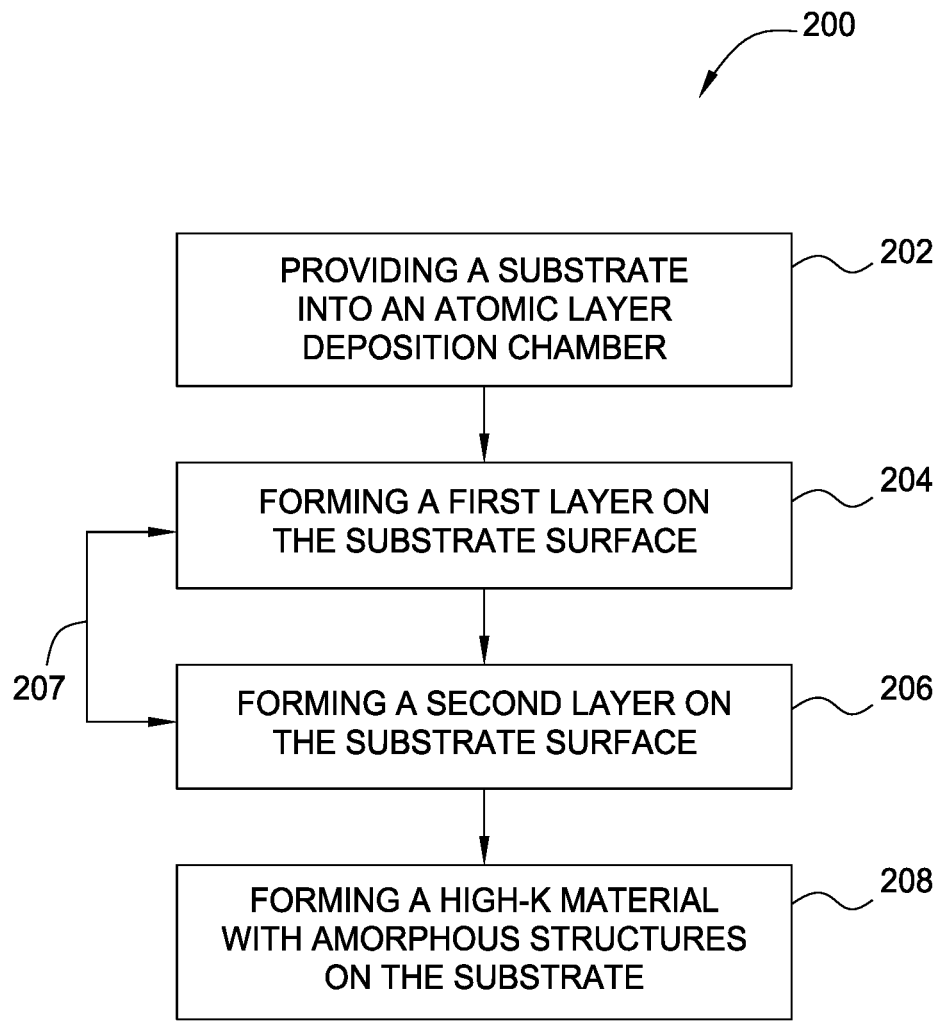
FIG. 2 depicts a process flow diagram of one embodiment of a method of forming a high dielectric constant film layer on a substrate.

FIG. 2 depicts a flow diagram of one embodiment of a process 200 for forming a high dielectric constant material layer suitable for use in display devices, such as thin-film transistor devices or OLED devices. Such high dielectric constant material layer may be formed as a capacitor layer disposed between two metal layers to form a capacitor. Suitable examples of the high dielectric constant material layer used in display devices include a gate insulating layer, a capacitor layer disposed between two metal layers, an interface layer, a dielectric layer utilized to form a capacitor, an etch stop layer or a passivation layer where an insulating material is needed. The high dielectric constant material layer may be formed by an atomic layer deposition (ALD) process or plasma assisted atomic layer deposition (ALD) process (PE-ALD), which may be practiced in the processing chamber 100, as described in FIG. 1, or other suitable processing chamber, or in combination thereof.

Figure 3A:
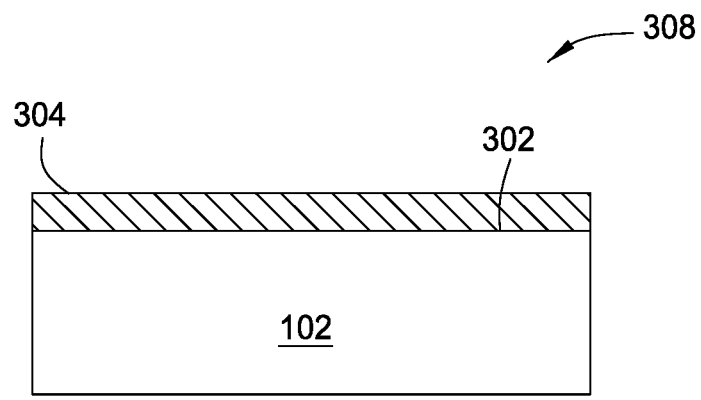
FIGS. 3A-3C depict a sectional view of one example of a portion of a thin film transistor device comprising a capacitor structure having a high dielectric constant film layer of FIG. 2 formed therein.

The process 200 begins at operation 202 by transferring the substrate 102 into a processing chamber, such as the processing chamber 100 (an ALD chamber) depicted in FIG. 1, to form a high dielectric constant material layer, as shown in FIG. 3A. The substrate 102 may have different combinations of films, structures or layers previously formed thereon to facilitate forming different device structures or different film stacks on the substrate 102. The substrate 102 may be any one of glass substrate, plastic substrate, polymer substrate, metal substrate, singled substrate, roll-to-roll substrate, or other suitable transparent substrate suitable for forming a thin film transistor thereon.

At operation 204, an atomic layer deposition (ALD) process is then performed on the substrate 102 to form a high dielectric constant material layer 308 (shown in FIG. 3C) on the substrate 102 by forming a first layer 304 on a surface 302 of the substrate 102. The first layer 304 is formed by performing a first reaction by supplying a first precursor, with or without the reactive gaseous species, onto an upper surface the substrate 102, as shown in FIG. 3A. The first layer 304 may be an inorganic material containing metal. Atomic layer deposition (ALD) process is a deposition process with self-terminating/limiting growth. The ALD process yields a thickness of only a few angstroms or in a monolayer level for each cycle of deposition. The ALD process is controlled by sequentially distributing chemical and reactant into a processing chamber which is repeated in cycles. The thickness of the high dielectric constant material layer to be formed by the ALD process on the substrate 102 depends on the number of the reaction cycles. The first reaction of the first precursor provides a first atomic layer of molecular layer, such as the first layer 304, being absorbed on the substrate 102 and the second reaction (will be described further below at operation 206) provide a second atomic layer of molecular layer, such as the second layer 306 shown in FIG. 3B, being absorbed on the first layer 304.

The first reaction may deposit the first layer 304 of the high dielectric constant material layer 308 having a thickness between about 0.5 Å and about 3 Å.

In one example, the first precursor utilized in the first pulse of reaction to form the first layer 304 includes a zirconium (Zr) containing precursor. Suitable examples of the zirconium containing precursor include Zr-organometallic precursors, such as tetrakis(ethylmethylamino)zirconium (TEMAZ), tris(dimethylamino)cyclopentadienyl zirconium ($C_5H_5$)Zr[N($CH_3$)$_2$]$_3$, or the like. In one particular example utilized herein, the first precursor is tetrakis(ethylmethylamino)zirconium (TEMAZ).

It is believed that utilizing the Zr containing precursor to form a Zr containing layer as the high dielectric constant material layer 308 by an atomic layer deposition (ALD) process may provide good film properties, such as high thermal stability, high deposition rate, low film leakage, high film density, low defect density and the like. Strong adherence of atoms in each layers and absorbability of the layers of atoms onto the surface of substrate provide compact and secured bonding structures in the film structures so as to render a film property with a high film density (compared to a chemical vapor deposition process) that may efficiently eliminate loose film structure in the dielectric layer that may result in current leakage. Furthermore, the high film density may also prevent moisture or contaminant from penetrating therethrough. Furthermore, the slow ALD deposition rate of the monolayers formed on the substrate also allows the atoms from each monolayer to gradually fill in the pinholes, pores, pits or defects that may be present on the substrate surface so as to assist repairing the film defects on the substrate surface.

The first pulse of reaction lasts for a predetermined time interval. The term pulse as used herein refers to a dose of material injected into the process chamber. Between each pulse of the first precursor or/and a second precursor and/or a reactive gaseous species, a purge gas mixture, such as a nitrogen gas, an inert gas (e.g., He or Ar) may be pulsed into the processing chamber in between each or multiple pulses of the first precursor or/and a second precursor and/or a reactive gaseous species (e.g., between the different metal containing gas and the oxygen containing gas) to remove the by-products, impurities or residual precursor gas mixture which is unreacted/non-absorbed by the substrate surface (e.g., unreacted impurities from the reactant gas mixture or others) so they can be pumped out of the processing chamber.

During the pulsing of the first precursor comprising Zr containing precursor, a reactive gaseous species may be supplied simultaneously with, alternatively, or sequentially with the first precursor (e.g., the Zr containing precursor as one example) for forming the first layer 304 during the deposition process. In one example, the reactive gaseous species supplied simultaneously with, alternatively, or sequentially with the first precursor may be oxygen containing gases, such as $H_2O$, $O_2$, $O_3$, $CO_2$, $H_2O_2$, $NO_2$, $N_2O$, and the like. In one example, the oxygen containing gas is $O_2$ or $O_3$. Alternatively, the reactive gaseous species may be supplied after a pulse of a pump/purge gas is performed to purge out the residual first precursor remained in the processing chamber 100.

During pulsing of the first precursor with or without the reactive gaseous species (e.g., the reactive gaseous species supplied after the first precursor), several process parameters are also regulated. In one embodiment, the process pressure is controlled at between about 0.1 Torr and about 1 Torr. The processing temperature is between about 40 degrees Celsius and about 300 degrees Celsius, such as about 200 degrees Celsius. In one embodiment, the RF source power is controlled at between about 500 watts and about 3500 watts, such as about 3000 Watts.

Thus, the first layer 304 shown in FIG. 3A may include Zr elements as well as oxygen elements, after the first pulse of the first precursor as well as the reactive gaseous species.

The first layer 304 comprises Zr and oxygen elements form a first portion of the high dielectric constant material layer 308.

Figure 3B:
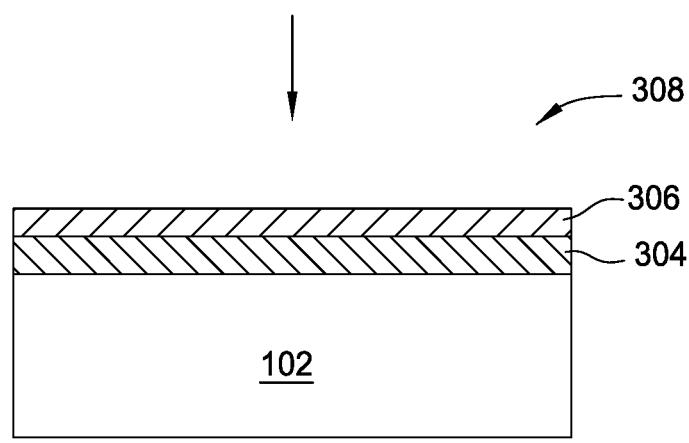

At operation 206, after the first reaction and a pump/purge process, a second reaction including a second precursor, with or without the reactive gaseous species, onto the first layer 304 to form a second layer 306 on the substrate 102, as shown in FIG. 3B. The second precursor is also a metal containing precursor but different from the first precursor. In one example, the second precursor includes aluminum. Suitable examples of the second precursor comprising aluminum may have a formula of $R_xAl_yR'_zR''_v$ or $R_xAl_y(OR')_z$, where R, R' and R'' are H, $CH_3$, $C_2H_5$, $C_3H_7$, CO, NCO, alkyl or aryl group and x, y, z and v are integers having a range between 1 and 8. In another embodiment, the aluminum containing compound may have a formula of Al(NRR')$_3$, where R and R' may be H, $CH_3$, $C_2H_5$, $C_3H_7$, CO, NCO, alkyl or aryl group and R' may be H, $CH_3$, $C_2H_5$, $C_3H_7$, CO, NCO, alkyl or aryl group. Examples of suitable aluminum containing compounds are diethylalumium ethoxide ($Et_2AlOEt$), triethyl-tri-sec-butoxy dialumium ($Et_3Al_2OBu_3$, or EBDA), trimethylaluminum (TMA), trimethyldialumium ethoxide, dimethyl aluminum isupropoxide, disecbutoxy aluminum ethoxide, (OR)$_2$AlR', wherein R, R' and R'' may be methyl, ethyl, propyl, isopropyl, butyl, isobutyl, tertiary butyl, and other alkyl groups having higher numbers of carbon atoms, and the like.

In one specific example, the second precursor comprising aluminum is trimethylaluminum (TMA).

Each reaction may deposit the second layer 306 of the high dielectric constant material layer 308 having a thickness between about 0.5 Å and about 3 Å.

It is believed that the second metal elements provided from the second precursor may be considered as a dopant doped in the high dielectric constant material layer 308 so as to render the resultant high dielectric constant material layer 308 in an amorphous structure. A $ZrO_2$ layer formed by an atomic layer deposition process often provides the resultant $ZrO_2$ in crystalline structure in cubic or tetragonal phase, providing a dielectric constant at least between about 25 and about 50. However, as the dielectric constant of a material increases, the band gap of the material decreases, leading to high leakage current in the device. Thus, by providing a dopant, such as a second element, in the material, the crystalline structure of the material may be altered into an amorphous state, thus lowering the dielectric constant of a certain predetermined level so as to keep the current leakage at a desired low level. For example, by providing a dopant, such as the second metal element comprising aluminum, into the $ZrO_2$ structure, may render the resultant $ZrO_2$ structure amorphous, thus, keeping the dielectric constant of the amorphous aluminum doped $ZrO_2$ at a range between about 15 and about 25.

The second reaction lasts for a predetermined time interval to form the second layer 306 comprising aluminum. During pulsing of the second precursor comprising Al containing precursor, a reactive gaseous species may be supplied simultaneously with, alternatively, or sequentially with the second precursor (e.g., the Al containing precursor as one example) for forming the second 306 during the deposition process. In one example, the reactive gaseous species supplied simultaneously with, alternatively, or sequentially with the first precursor may be oxygen containing gases, such as $H_2O$, $O_2$, $O_3$, $CO_2$, $H_2O_2$, $NO_2$, $N_2O$, and the like. In one example, the oxygen containing gas is $O_2$ or $O_3$. Alternatively, the reactive gaseous species may be supplied after a pulse of a pump/purge gas is performed to purge out the residual second precursor remained in the processing chamber 100.

During supplying of the second precursor with or without the reactive gaseous species (e.g., the reactive gaseous species supplied after the first precursor), several process parameters are also regulated. In one embodiment, the process pressure is controlled at between about 0.1 Torr and about 1 Torr. The processing temperature is between about 40 degrees Celsius and about 300 degrees Celsius, such as about 200 degrees Celsius. The RF source power is controlled at between about 500 watts and about 3500 watts, such as about 3000 Watts.

Thus, the second layer 306 shown in FIG. 3B may include Al elements as well as oxygen elements, after the second pulse of the second precursor as well as the reactive gaseous species. The second layer 306 comprises Al and oxygen elements form a second portion of the high dielectric constant material layer 308.

It is noted that the first reaction at operation 204 and the second reaction at operation 206 may be repeatedly performed, as indicated by the loop 207, forming an upper most first layer 304' and an upper most second layer 306', until a desired thickness of the overall high dielectric constant material layer 308 is reached.

Figure 3C:
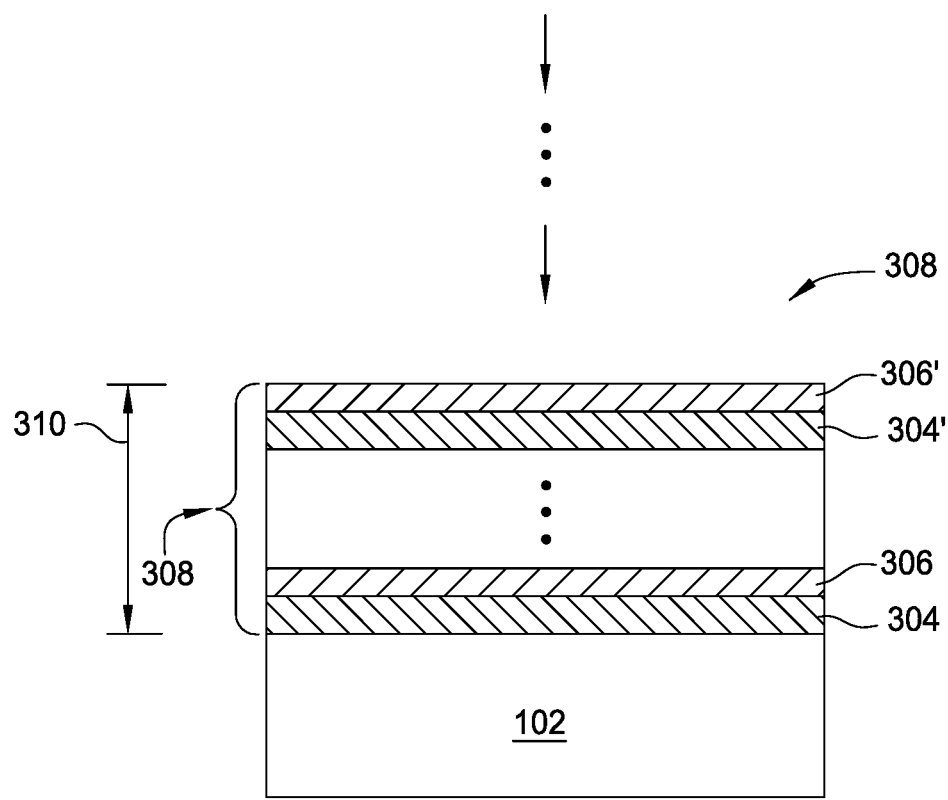

At operation 208, after a number of repeating cycles of the first pulse and the second pulse of reactions at operation 204 and 206, the high dielectric constant material layer 308 is then formed on the substrate, as shown in FIG. 3C. In one example, a total of about 200 cycles of operation 204 and 206 may be performed to form the high dielectric constant material layer 308. The resultant high dielectric constant material layer 308 may include multiple layers of the repeating first and second layers (the bottom first and second layer 304, 306 and the upper most first and the second layer shown as 304', 306') until a desired thickness 310 is reached. In one example, the desired thickness 310 may be between about 25 nm and about 90 nm. The high dielectric constant material layer 308 may have a dielectric constant between about 15 and 25 and a film leakage about 1E-8A/cm$^2$ or below. The high dielectric constant material layer 308 has an aluminum dopant in a $ZrO_2$ structure with a doping concentration between 6 atm. % and about 20 atm. % (between elements of Zr and Al).

The deposition process 200 forms the high dielectric constant material layer with a dielectric constant greater than 10, such as greater than 15, for example between about 15 and 25. In one example, the resultant high dielectric constant material layer 308 is a $ZrO_2$ layer with Al dopants having an amorphous structure.

It is noted that the dopant may affect the range of the dielectric constant resulted in the high dielectric constant material layer 308. In one example, when the aluminum dopant in a $ZrO_2$ structure with a doping concentration may be controlled less than 5 atm. % (between elements of Zr and Al), which may result in the high dielectric constant material layer 308 has a structure in substantially crystalline structure having a dielectric constant between about 25 and 45. In another example, the aluminum dopant in a $ZrO_2$ structure with a doping concentration may be controlled between 6 atm. % and about 20 atm. % (between elements of Zr and Al), which may result in the high dielectric constant material layer 308 has a structure in amorphous structure having a dielectric constant between about 15 and 25. In yet another example, the aluminum dopant in a $ZrO_2$ structure with a doping concentration may be controlled between 20 atm. % and about 100 atm. % (between elements of Zr and Al), which may result in the high dielectric constant material layer 308 having an amorphous structure with a dielectric constant between about 9 and 15.

In some examples, the Al dopants in the high dielectric constant material layer 308 could also be replaced as silicon dopants. For example, a silicon containing dopant, such as $SiO_2$, may also be used in the $ZrO_2$ material to form a film layer with dielectric constant greater than 15, for example between about 15 and 25.

Figure 4:
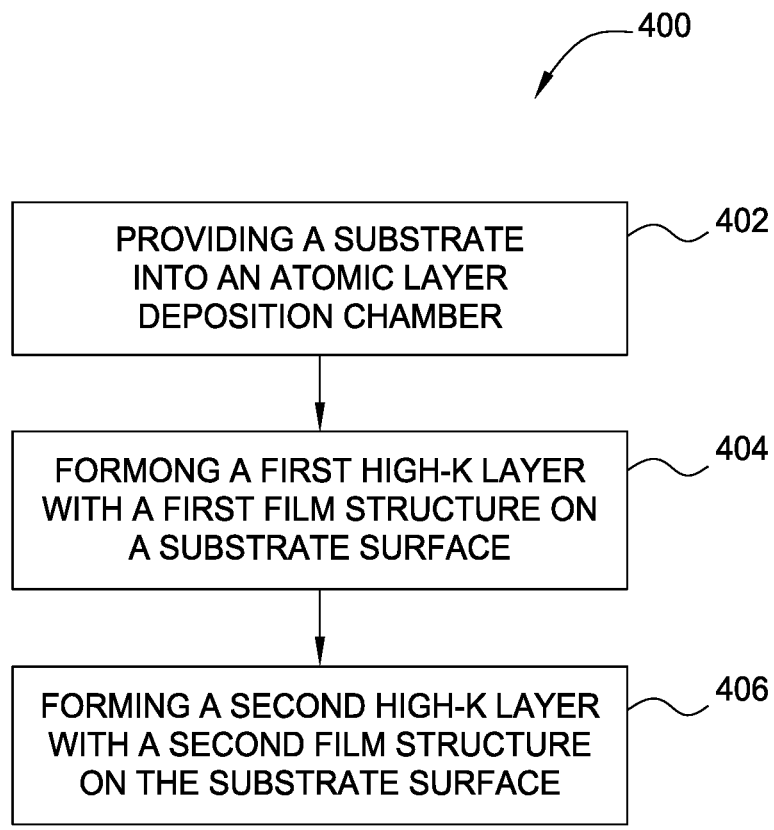
FIG. 4 depicts a process flow diagram of one embodiment of a method of forming a composite film layer with high dielectric constant on a substrate.

FIG. 4 depicts a flow diagram of one embodiment of a process 400 for forming a composite film layer with high dielectric constant as well as low film leakage suitable for use in display devices, such as thin-film transistor devices or OLED devices. Such composite film layer with high dielectric constant may be formed as a capacitor layer disposed between two metal layers to form a capacitor. Suitable examples of the composite film layer with high dielectric constant used in display devices include a gate insulating layer, a capacitor layer disposed between two metal layers, an interface layer, a dielectric layer utilized to form a capacitor, an etch stop layer or a passivation layer where an insulating material is needed. The high dielectric constant material layer may be formed by an atomic layer deposition (ALD) process or plasma assisted atomic layer deposition process (PE-ALD), which may be practiced in the processing chamber 100, as described in FIG. 1, or other suitable processing chamber, or in combination thereof.

Figure 5A:
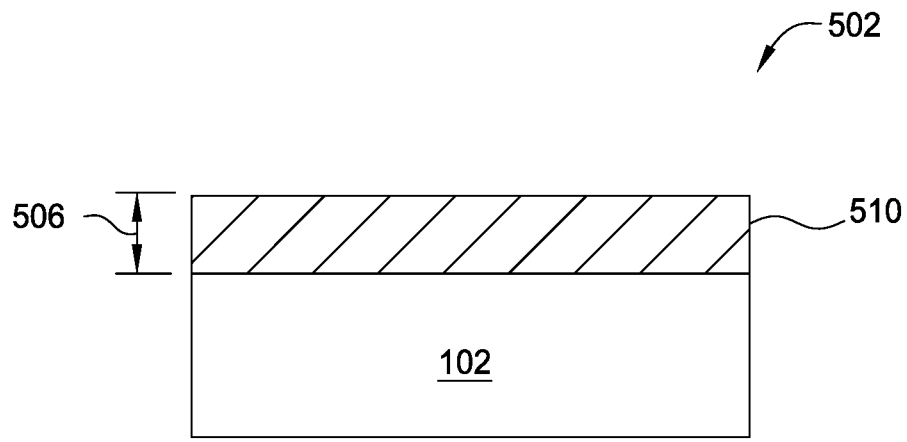
FIGS. 5A-5C depict a sectional view of one example of a portion of a thin film transistor device structure having a composite film layer with high dielectric constant of FIG. 4 formed therein.

The process 400 begins at operation 402 by transferring the substrate 102 into a processing chamber, such as the processing chamber 100 (an ALD chamber) depicted in FIG. 1, to form a composite film layer 502 with a high dielectric constant on the substrate 102, as shown in FIG. 5A.

At operation 404, an atomic layer deposition (ALD) process is then performed on the substrate 102 to form a first layer 510 of the composite film layer 502, as shown in FIG. 5A. The first layer 510 of the composite film layer 502 may be formed by an ALD process. The first layer 510 may be formed by performing a first type of reaction of the ALD process by continuously pulsing precursor gas mixtures (more than one type of precursor gas mixtures), with or without the reactive gaseous species, onto the substrate 102, as shown in FIG. 5A, forming the first layer 510 may be an inorganic material containing metal. It is noted that the reactive gaseous species may be pulsed simultaneously, alternatively, or sequentially with the precursor gas mixtures to form the first layer 510 of the composite film layer 502. Between the pulses of the reactive gaseous species and the precursor gas mixtures, a pump/purge process may be performed to remove the precursor residuals from the processing chamber prior to another pulse.

The thickness, shown by arrows 506, of the composite film layer 502 to be formed by the ALD process on the substrate 102 depends on the number of the reaction cycles. In one example, the first layer 510 of the composite film layer 502 has a thickness between about 25 nm and about 90 nm.

In one example, the precursor mixtures utilized to form the first layer 510 may include alternatively or sequentially supplying a zirconium containing precursor and an aluminum containing precursor with or without the reactive gaseous species to form an aluminum doped zirconium (Zr) containing layer. Suitable zirconium containing precursor include Zr-organometallic precursors, such as tetrakis(ethylmethylamino)zirconium (TEMAZ), tris(dimethylamino) cyclopentadienyl zirconium $(C_5H_5)Zr[N(CH_3)_2]_3$, or the like. In one particular example utilized herein, the zirconium containing precursor is tetrakis(ethylmethylamino)zirconium (TEMAZ).

Suitable examples of the aluminum containing precursor may have a formula of $R_xAl_yR'_zR''_v$ or $R_xAl_y(OR')_z$, where R, R' and R" are H, $CH_3$, $C_2H_5$, $C_3H_7$, CO, NCO, alkyl or aryl group and x, y, z and v are integers having a range between 1 and 8. In another embodiment, the aluminum containing compound may have a formula of $Al(NRR')_3$, where R and R' may be H, $CH_3$, $C_2H_5$, $C_3H_7$, CO, NCO, alkyl or aryl group and R' may be H, $CH_3$, $C_2H_5$, $C_3H_7$, CO, NCO, alkyl or aryl group. Examples of suitable aluminum containing compounds are diethylalumium ethoxide ($Et_2AlOEt$), triethyl-tri-sec-butoxy dialumium ($Et_3Al_2OBu_3$, or EBDA), trimethylaluminum (TMA), trimethyldialumium ethoxide, dimethyl aluminum isupropoxide, disecbutoxy aluminum ethoxide, $(OR)_2AlR'$, wherein R, R' and R" may be methyl, ethyl, propyl, isopropyl, butyl, isobutyl, tertiary butyl, and other alkyl groups having higher numbers of carbon atoms, and the like. In one specific example, the aluminum containing precursor is trimethylaluminum (TMA).

The reactive gaseous species may be oxygen containing gases, such as $H_2O$, $O_2$, $O_3$, $H_2O_2$, $CO_2$, $NO_2$, $N_2O$, and the like. In one example, the oxygen containing gas is $O_2$ or $O_3$.

It is believed that second metal elements, e.g., the aluminum containing dopants, formed and doped into the first layer 510 (e.g., Zr containing layer) may be considered as dopants doped in the composite film layer 502 so as to render the first layer 510 of the $ZrO_2$ layer as an amorphous structure. A $ZrO_2$ layer formed by an atomic layer deposition process often provides the $ZrO_2$ in crystalline structure in cubic or tetragonal phase or mix of cubic and tetragonal phases, providing a dielectric constant at least greater than 25, such as between about 25 and about 50. However, as the dielectric constant of a material increases, the band gap of the material decreases, leading to high leakage current in the device. Thus, higher dielectric constant, e.g., greater than 25, of a dielectric layer is desired for the advanced technologies so as to provide a capacitor with higher capacitance. In contrast, higher dielectric constant, e.g., greater than 25, of the dielectric layer also often results in high film leakage that may eventually lead to device failure. Thus, by forming the first layer 510 of the composite film layer 502 with a relatively low dielectric constant (e.g., greater than 10 but less than 25), the composite film layer 502 may keep certain degree of low film leakage. Thus, by providing a dopant, such as the aluminum dopants, formed in the first layer 510 of the composite film layer 502, the crystalline structure of the material may be altered into an amorphous state, thus lowering the dielectric constant of a certain predetermined level so as to keep the current leakage at a desired low level. For example, by providing aluminum dopant into the $ZrO_2$ structure to form the first layer 510 may render the resultant $ZrO_2$ structure in amorphous state, thus, keeping the dielectric constant of the amorphous aluminum doped $ZrO_2$ at a desired range less than 25 but above 10. Subsequently, the second layer 512 of composite film layer 502 is formed by a $ZrO_2$ in crystalline structure in cubic or tetragonal phase or mix of cubic and tetragonal phases (e.g., dielectric constant greater than 25) to increase the capacitance of the resultant composite film layer 502, which will be described below in detail at operation 406.

In one example, the precursor gas mixtures supplied in the first type of reaction for forming the first layer 510 include pulsing a first precursor comprising Zr containing precursor with or without the oxygen containing gas as the reactive gaseous species. In the example wherein the oxygen containing gas is not supplied with the Zr containing precursor, the oxygen containing gas may be supplied after the Zr containing precursor is supplied to the processing chamber 100 after a pump/purge process. After the first precursor comprising a Zr containing precursor is pulsed, a second precursor comprising Al containing precursor may then be pulsed to continue forming the first layer 510, forming the first layer 510 as an aluminum doped $ZrO_2$ layer. Similarly, the second precursor comprising an Al containing precursor may be supplied with or without the oxygen containing gas as the reactive gaseous species. In the example wherein the oxygen containing gas is not supplied with the Al containing precursor, the oxygen containing gas may be supplied after the Al containing precursor is supplied to the processing chamber 100 after a pump/purge process. It is noted that the sequence of supplying the first precursor comprising a Zr containing precursor and the second precursor comprising an Al containing precursor may be reversed or in any order as needed. It is noted that the reactive gaseous species always serves as a reactive species to be supplied between each pulse of the first and the second precursors to form $ZrO_2$ or Al doped $ZrO_2$.

The pulses of the first type of reaction at operation 404 last for a predetermined time interval. The term pulse as used herein refers to a dose of material injected into the process chamber. Between each pulse of the first precursor or/and a second precursor and/or a reactive gaseous species, a purge gas mixture, such as a nitrogen gas, an inert gas (e.g., He or Ar) may be pulsed into the processing chamber in between each or multiple pulses of the first precursor or/and a second precursor and/or a reactive gaseous species (e.g., between the different metal containing gas and the oxygen containing gas) to remove the by-products, impurities or residual precursor gas mixture which is unreacted/non-absorbed by the substrate surface (e.g., unreacted impurities from the reactant gas mixture or others) so they can be pumped out of the processing chamber.

The first layer 510 of the composite film layer 502 may have a dielectric constant greater than 10, such as between 15 and 25 and a film leakage about $1E-8A/cm^2$ or below. The first layer 510 of the composite film layer 502 has an aluminum dopant in a $ZrO_2$ structure with a doping concentration between about 6 atm. % and about 20 atm. % (between elements of Zr and Al).

During the first type of reaction of forming the first layer 510 at operation 404, several process parameters are also regulated. In one embodiment, the process pressure is controlled at between about 0.1 Torr and about 1 Torr. The processing temperature is between about 40 degrees Celsius and about 300 degrees Celsius, such as about 200 degrees Celsius. The RF source power is controlled at between about 500 watts and about 3500 watts, such as about 3000 Watts.

It is noted that the dopant may affect the range of the dielectric constant resulted in the first layer 510. In one example, when the aluminum dopant in a $ZrO_2$ structure with a doping concentration may be controlled less than 5 atm. % (between elements of Zr and Al), which may result in the resultant first layer 510 has a structure in substantially crystalline structure having a dielectric constant between about 25 and 45. In another example, the aluminum dopant in a $ZrO_2$ structure with a doping concentration may be controlled between 5 atm. % and about 20 atm. % (between elements of Zr and Al), which may result in the resultant first layer 510 has a structure in amorphous structure having a dielectric constant between about 15 and 25. In yet another example, the aluminum dopant in a $ZrO_2$ structure with a doping concentration may be controlled between 20 atm. % and about 100 atm. % (between elements of Zr and Al), which may result in the resultant first layer 510 has a structure in amorphous structure having a dielectric constant between about 9 and 15.

In some examples, the Al dopants in the first layer 510 could also be replaced as silicon dopants. For example, a silicon containing dopant, such as SiO2, may also be used in the ZrO2 material to form a film layer with dielectric constant greater than 15, for example between about 15 and 25.

At operation 406, after the first layer 510 of the composite film layer 502 is formed, the second layer 512 is formed on the first layer 510 by a second type of reaction of the ALD process performed to form the composite film layer 502. The second layer 512 has a thickness shown by arrows 514. As discussed above, in order to maintain the resultant composite film layer 502 with desired high dielectric constant level while having the desired low film leakage, the second layer 512 is formed to have predominately $ZrO_2$ layer in crystalline structure in cubic or tetragonal phase or mix of cubic and tetragonal phases, providing a dielectric constant at least greater than 25, such as between about 35 and about 50. The second layer 512 of $ZrO_2$ layer formed by the atomic layer deposition process often provides the resultant $ZrO_2$ in crystalline structure (e.g., in cubic and/or tetragonal phase or combinations thereof) so as to provide the resultant composite film layer 502 with desired two-layer structure including amorphous and crystalline structures.

It is noted that by controlling minimum Al dopant concentration (e.g., less than 5 atomic %), a crystalline structure (e.g., in cubic and/or tetragonal phase or combinations thereof) of the second layer 512 may also be obtained It is believed that utilizing the Zr containing layer as the second layer 312 of the resultant composite film layer 502 by an atomic layer deposition (ALD) process may provide good film properties, such as high thermal stability, high deposition rate, high film density, low defect density and the like.

In one example, the precursor gas mixture supplied in the second type of reaction for forming the second layer 512 includes pulsing the precursor comprising a Zr containing precursor with or without the oxygen containing gas as the reactive gaseous species. In the example wherein the oxygen containing gas is not supplied with the Zr containing precursor, the oxygen containing gas may be supplied after the Zr containing precursor is supplied to the processing chamber 100 after a pump/purge process.

During the supply of the precursor comprising a Zr containing precursor, a reactive gaseous species may be supplied simultaneously with, alternatively, or sequentially with the precursor (e.g., the Zr containing precursor as one example) for forming the second layer 512 during the deposition process. The reactive gaseous species may be supplied after a pulse of a pump/purge gas is performed to purge out the residual first precursor remained in the processing chamber 100. The pulses of the second type of reaction at operation 406 last for a predetermined time interval. Between each pulse of the precursor and/or a reactive gaseous species, a purge gas mixture, such as a nitrogen gas, an inert gas (e.g., He or Ar) may be pulsed into the processing chamber in between each or multiple pulses of the precursor and/or a reactive gaseous species (e.g., between the metal containing gas and the oxygen containing gas) to remove the impurities or residual precursor gas mixture which is unreacted/non-absorbed by the substrate surface (e.g., unreacted impurities from the reactant gas mixture or others) so they can be pumped out of the processing chamber. It is noted that the reactive gaseous species always serves as a reactive species to be supplied between each pulse of precursor to form $ZrO_2$ as the second layer 512.

The second layer 512 of the composite film layer 502 may have a dielectric constant greater than 25, such as between 25 and 50, In one example, the second layer 512 of the composite film layer 502 has a thickness between about 25 nm and about 90 nm During the second type of reaction of forming the second layer 512 at operation 406, several process parameters are also regulated. In one embodiment, the process pressure is controlled at between about 0.1 Torr and about 1 Torr. The processing temperature is between about 40 degrees Celsius and about 300 degrees Celsius, such as about 200 degrees Celsius. The RF source power is controlled at between about 500 watts and about 3500 watts, such as about 3000 watts.

In one example, the second precursor comprising aluminum supplied at operation 404 to form the first layer 510, e.g., the aluminum doped $ZrO_2$ layer, may be eliminated from supplying when the first layer 510 has reached to the desired thickness, thus leaving the first precursor comprising zirconium continuously pulsing and supplying (with or without the reactive species) to form the second layer 512 predominately comprising zirconium oxide. It is noted that the reactive gaseous species always serves as a reactive species to be supplied between each pulse of the first precursor comprising Zr and/or the second precursor comprising Al to form $ZrO_2$ or Al doped $ZrO_2$.

By adjusting thickness ratio between first and the second layers 510, 512, the resultant composite film layer 502 may have an average film dielectric constant between about 15 and about 35.

It is noted that the order of the first and the second layer 510, 512 formed on the substrate 102 may be in any order or may be for as many times as possible. For example, the composite film layer 502 may has as many repeating first and second layers 510, 512 as needed in any order.

Figure 5B:
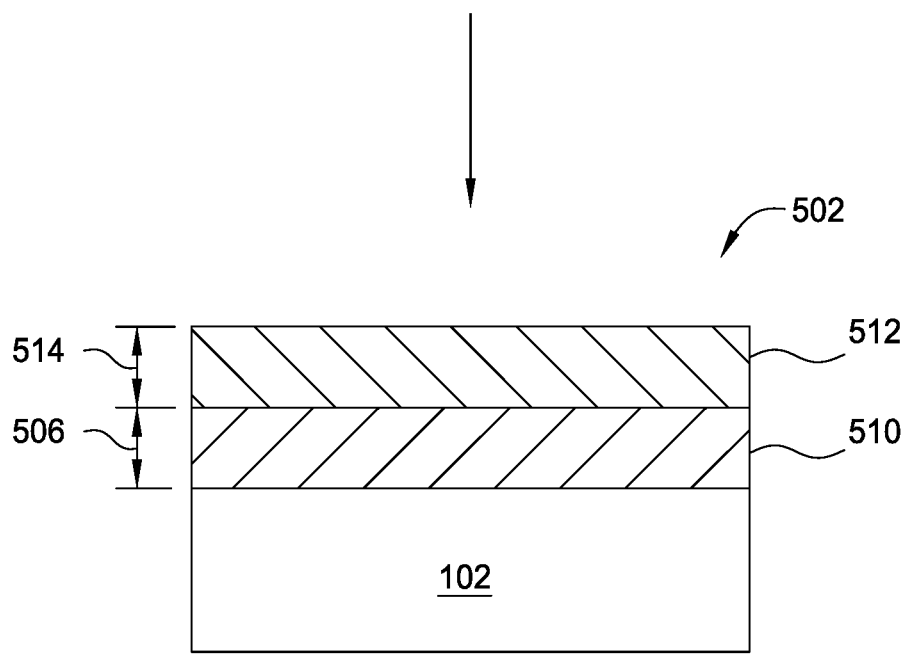

In some examples, the composite film layer 502 in FIG. 5A-5B or the high dielectric constant material layer 308 in FIG. 3A-3C may also be formed as aluminum containing layers or hafnium containing layers, rather than Zr containing layers.

In one example, an additionally aluminum containing layer, such as $Al_2O_3$ and $Al_2N_3$, may be formed at the interface between the substrate and the composite film layer 502, or between the high dielectric constant material layer 308 and the substrate, or above the composite film layer 502, or above the high dielectric constant material layer 308 in the device structure as needed.

Figure 5C:
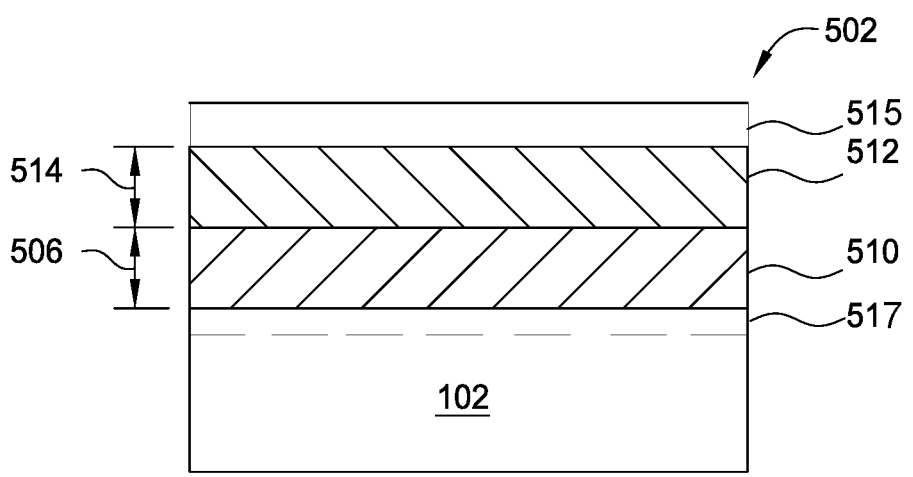

Additionally, instead of the additionally aluminum containing layer formed at the interface, above or below the first and the second layers 510, 512, an additional layer 515 may be formed on the second layer 512, as shown in FIG. 5C. Similarly, the additional layer 515 may also be formed by ALD or PE-ALD process. As discussed above, in order to maintain the resultant composite film layer 502 with desired high dielectric constant level while having the desired low film leakage, the additional layer 515 formed on the second layer 512 may be a heavily aluminum doped $ZrO_2$ layer, that renders the additional layer 515 is amorphous state comprising mostly aluminum oxide. The additional layer 515 may have a dielectric constant between about 9 and about 15. The concentration of Al in the ZrO2 layer is greater than 20 atomic %, such as between about 20 atomic % and about 100 atomic %.

It is noted that the heavily doped $ZrO_2$ layer may be formed below the first layer 510 above the substrate 103, as shown in dotted line as the additional layer 517 in FIG. 5C. Furthermore, the order for forming the first and the second layer 510, 512 may be in any arrangement, such as forming the second layer 512 first in contact with the substrate 102 (or the additional layer 517) then followed with the first layer 510 on the substrate 512 as needed.

Figure 6A:
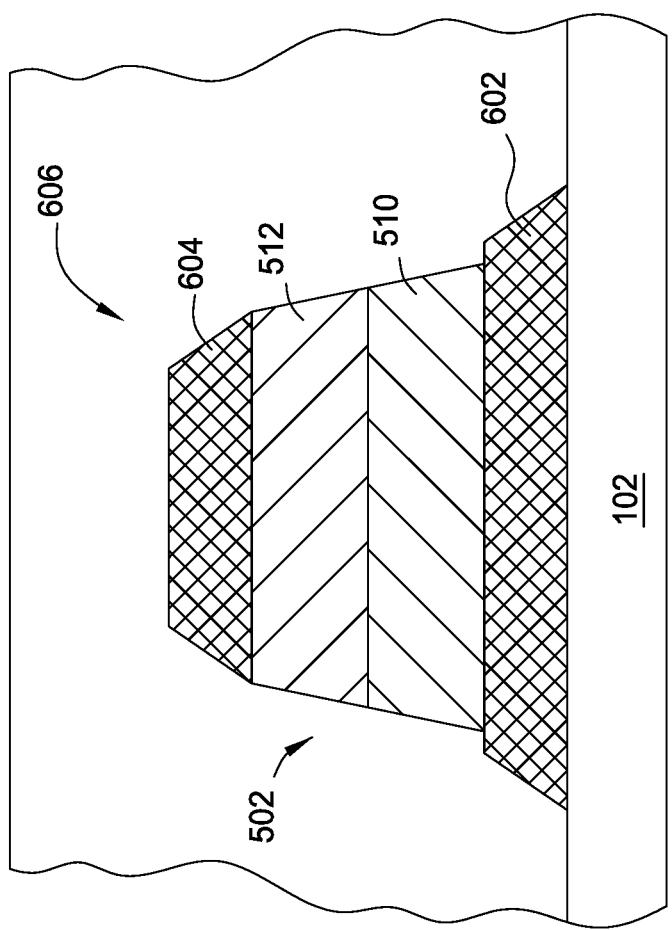
FIG. 6A-6B are sectional views of a capacitor structure formed in a display device structure.
Figure 6B:
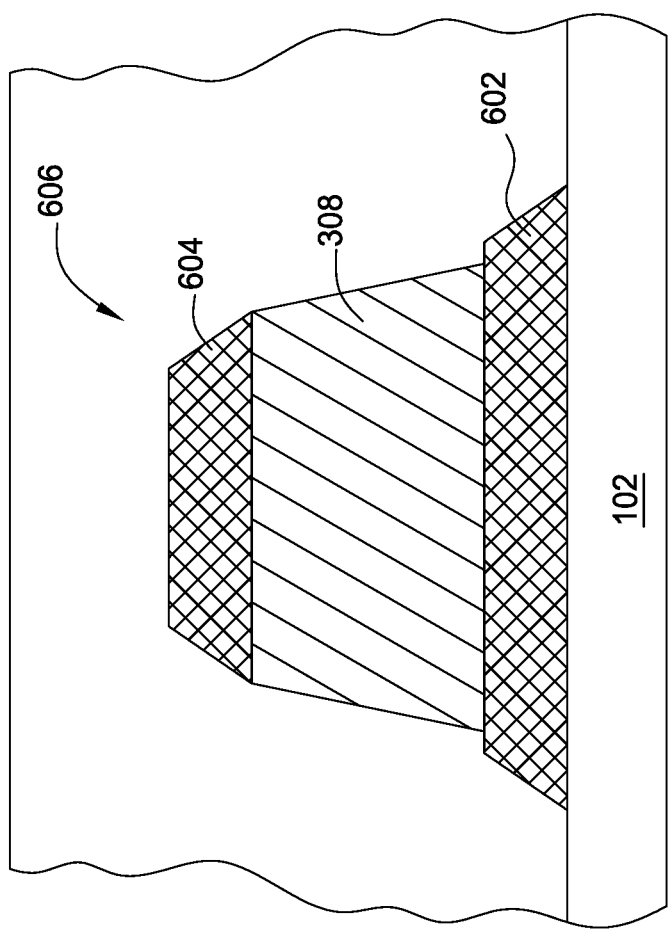

FIG. 6A depicts a simple capacitor structure 606 (e.g., a MIM (metal-insulating-metal) structure) that may be formed on the substrate 102 utilized in in display devices. The capacitor structure 606 includes a top electrode 604 and a bottom electrode 602 having the composite film layer 502 disposed therebetween. The composite film layer 502 includes the first layer 510 of aluminum doped $ZrO_2$ and the second layer 512 of $ZrO_2$. The composite film layer 502 provides a high dielectric constant (e.g., a portion between 35 and 50 and a portion between 15 and 25) to serve as a capacitor layer between the electrodes 604, 602 to form the capacitor structure 606. The composite film layer 502 serving as the capacitor layer in the capacitor structure 606 may also in form of any numbers of the layers as needed. Alternatively, the capacitor structure 606 may have the high dielectric constant material layer 308, as described above in FIG. 3, as a capacitor layer disposed in between to form the capacitor structure 606, as shown in FIG. 6B. The capacitor layer comprises a high-k material comprising $ZrO_2$ including aluminum dopants. The high dielectric constant material layer 308 serving as a capacitor layer in a capacitor structure may also in form of any numbers of the layers as needed.

Figure 7A:
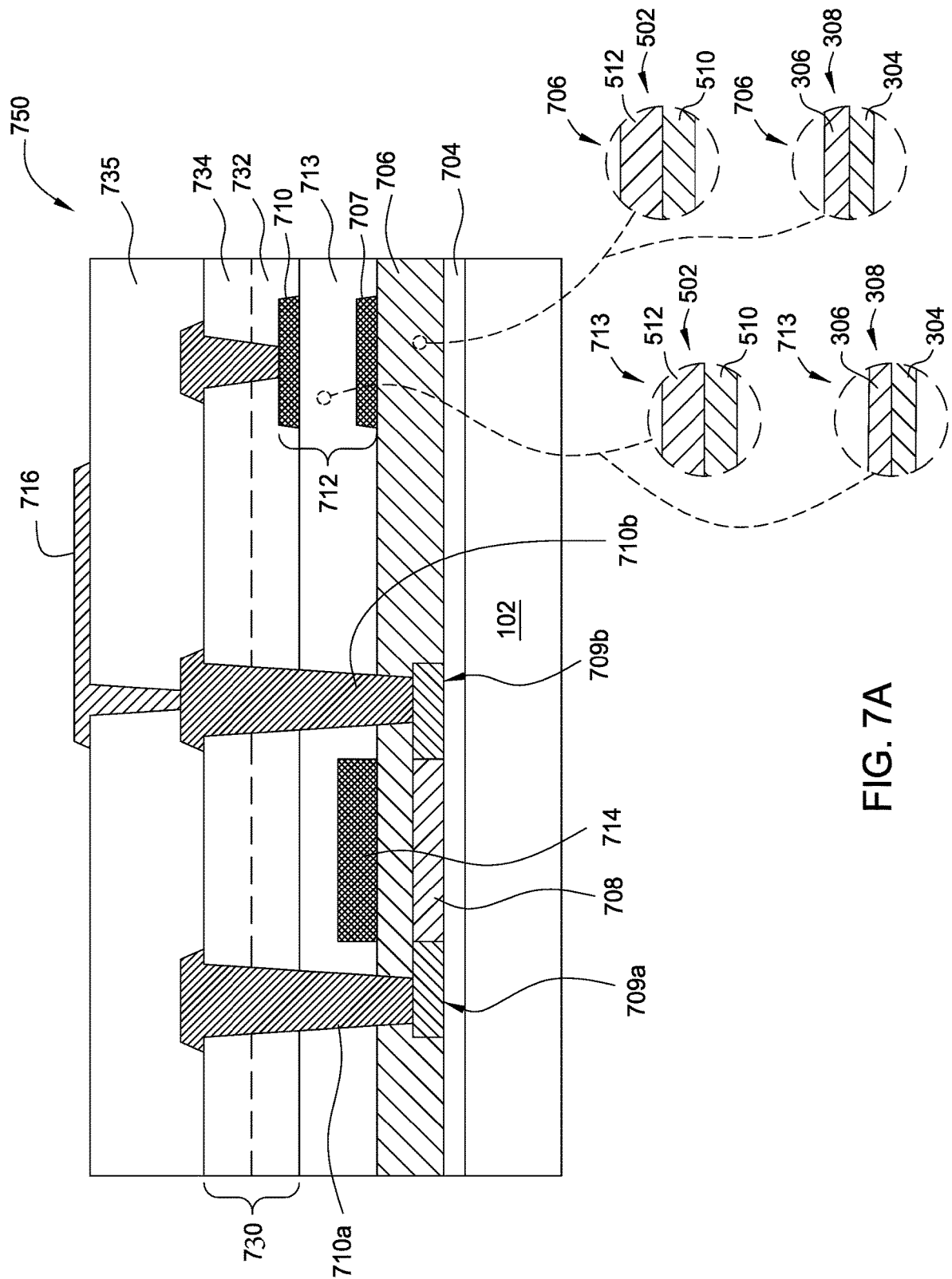
FIG. 7A is a cross sectional view of one example of a display device structure with a capacitor structure formed therein.

FIG. 7A depicts an example of a TFT structure 750 utilizing the composite film layer 502 in FIG. 5A-5B or the high dielectric constant material layer 308 in FIG. 3A-3C in the TFT structure 750 to form a capacitor. A portion of the exemplary TFT device structure 750 is depicted in FIG. 7A formed on the substrate 102. The TFT device structure 750 comprises a low temperature polysilicon (LTPS) TFT for OLED device. The LTPS TFT device structure 750 are MOS devices built with a source region 709a, channel region 708, and drain region 709b formed on the optically transparent substrate 102 with or without an optional insulating layer 704 disposed thereon. The source region 709a, channel region 708, and drain region 709b are generally formed from an initially deposited amorphous silicon (a-Si) layer that is typically later thermal or laser processed to form a polysilicon layer. The source, drain and channel regions 709a, 708, 709b can be formed by patterning areas on the optically transparent substrate 102 and ion doping the deposited initial a-Si layer, which is then thermally or laser processed (e.g., an Excimer Laser Annealing process) to form the polysilicon layer. A gate insulating layer 706 (e.g., the insulating layer or the composite film layer 502 of FIGS. 5A-5B with high dielectric constant formed by the process 400 of FIG. 4 or the high dielectric constant material layer 308 in FIG. 3A-3C formed by the process 200 of FIG. 2) may be then deposited on top of the deposited polysilicon layer(s) to isolate a gate electrode 714 from the channel region 708, source region 709a and drain regions 709b. The gate electrode 714 is formed on top of the gate insulating layer 706. The gate insulating layer 706 is also commonly known as a gate oxide layer. A capacitor layer 713 (e.g., may also be the insulating layer or the composite film layer 502 of FIGS. 5A-5B with high dielectric constant formed by the process 400 of FIG. 4 or the high dielectric constant material layer 308 in FIG. 3A-3C formed by the process 200 of FIG. 2) and device connections are then made through the insulating material to allow control of the TFT device. As indicated by the circles in FIG. 7A, the gate insulating layer 706 and the capacitor layer 713 in the TFT device structure 750 may also be fabricated by the composite film layer 502 with high dielectric constant as well as the low film leakage including the first layer 510 and the second layer 512 formed thereon or by the high dielectric constant material layer 308 including the first layer 304 and the second layer 306.

The device structure 750 of FIG. 7A is just partially formed for ease of description and explanation regarding to where the composite film layer 502 and the high dielectric constant material layer 308 may be utilized in some locations in the device structure 750 utilized to form either the gate insulating layer 706 or the capacitor layer 713, or both, in the device structure 750.

After the capacitor layer 713 is formed, an interlayer insulator 730 may be formed on the capacitor layer 713. The interlayer insulator 730 may be any suitable dielectric layer, such as silicon oxide or silicon nitride materials. The interlayer insulator 730 may be in form of a single layer formed on the capacitor layer 713. Alternatively, the interlayer insulator 730 may be in form of multiple layers as needed for different device requirements. In the example depicted in FIG. 7A, the interlayer insulator 730 includes a first dielectric layer 732 of silicon nitride formed on a second dielectric layer 734 of a silicon oxide layer. Subsequently, a source-drain metal electrode layer 710a, 710b is then deposited, formed and patterned in the interlayer insulator 730, the capacitor layer 713 and the gate insulating layer 706 electrically connected to the source region 709a and drain regions 709b.

After the source-drain metal electrode layer 710a, 710b is patterned, the planarization layer 735 is then formed over the source-drain metal electrode layer 710a, 710b. The planarization layer 735 may be fabricated from polyimide, benzocyclobutene-series resin, spin on glass (SOG) or acrylate. The planarization layer 735 is later patterned to allow a pixel electrode 716 to be formed on and filled in the planarization layer 735, electrically connecting to the source-drain metal electrode layer 710a, 710b.

In this example depicted in FIG. 7A, the capacitor layer 713 is formed on the gate electrode 714 extending to a capacitor structure 712 (e.g., a MIM (metal-insulating-metal) structure) formed between an upper electrode 710 and a lower electrode 707. The upper electrode 710 may be laterally coupled to the source-drain metal electrode layer 710a, 710b while the lower electrode 707 may be laterally coupled to the gate electrode 714, or other suitable electrodes in the device structure 750. The capacitor structure 712 formed in the device structure 750 may be a storage capacitor that may improve the display device electrical performance. It is noted that the capacitor structure 712 may be formed in any location suitable in the device structure 750 as needed for different device performance requirements.

Figure 7B:
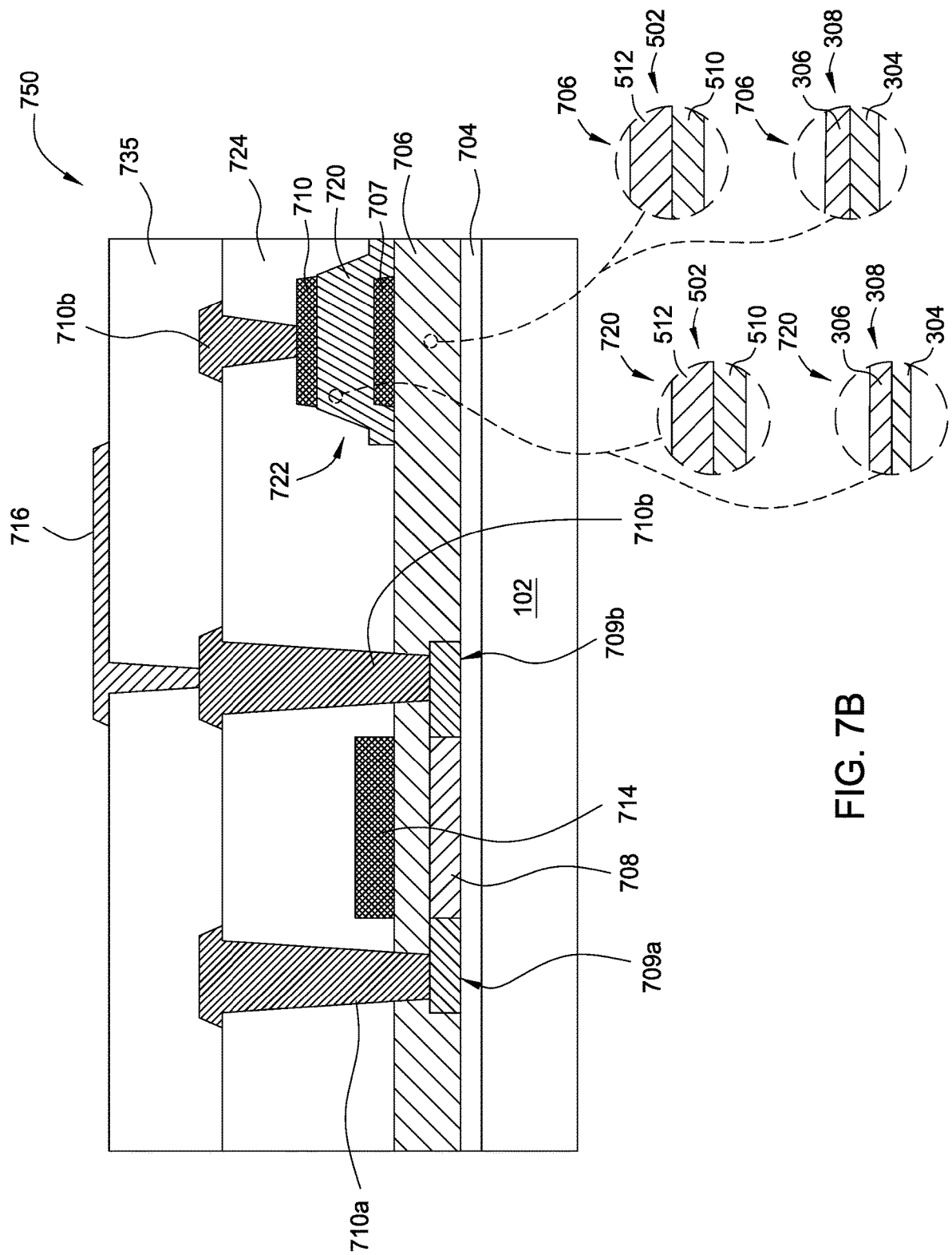
FIG. 7B is a cross sectional view of another example of a display device structure with a capacitor structure formed therein.

In another example depicted in FIG. 7B, a capacitor structure 722, similar to the capacitor structure 712 depicted in FIG. 7A, may be formed with different dimensions and/or profiles of the composite film layer 502 severing as a capacitor layer 720 formed between the upper electrode 710 and the lower electrode 707. Unlike the capacitor layer 713 extends from the area above the gate electrode 714 to the area between the upper and the lower electrode 710, 707, the capacitor layer 720 depicted in FIG. 7B is formed substantially in the area between the upper and the lower electrodes 710, 707. Thus, an interlayer insulator 724 comprising silicon oxide or silicon oxide may be formed on the gate insulting layer 706 surrounding the capacitor structure 722. The composite film layer 502 or the high dielectric constant material layer 308 formed as the capacitor layer 720 in the capacitor structure 722 may have a bottom surface in contact with the lower gate insulating layer 706 as needed. The interlayer insulator 724 may be in a single layer form, as depicted in FIG. 7B, or in multiple layer form as needed.

It is noted that the composite film layer 502 or the high dielectric constant material layer 308 formed by the process 200 or 300 respectively may be utilized to form the capacitor layer 720, gate insulating layer 706, as indicated in the circles of FIG. 7B, a passivation layer or any other suitable layers that require insulating materials in the TFT device structures 750 including LTPS TFT for LCD or OLED TFT as needed.

It is noted that the upper electrode 710 and the lower electrode 707 utilized to form the capacitor structures 722, 712 may also be pixel electrodes and/or common electrodes as needed.

Figure 8:
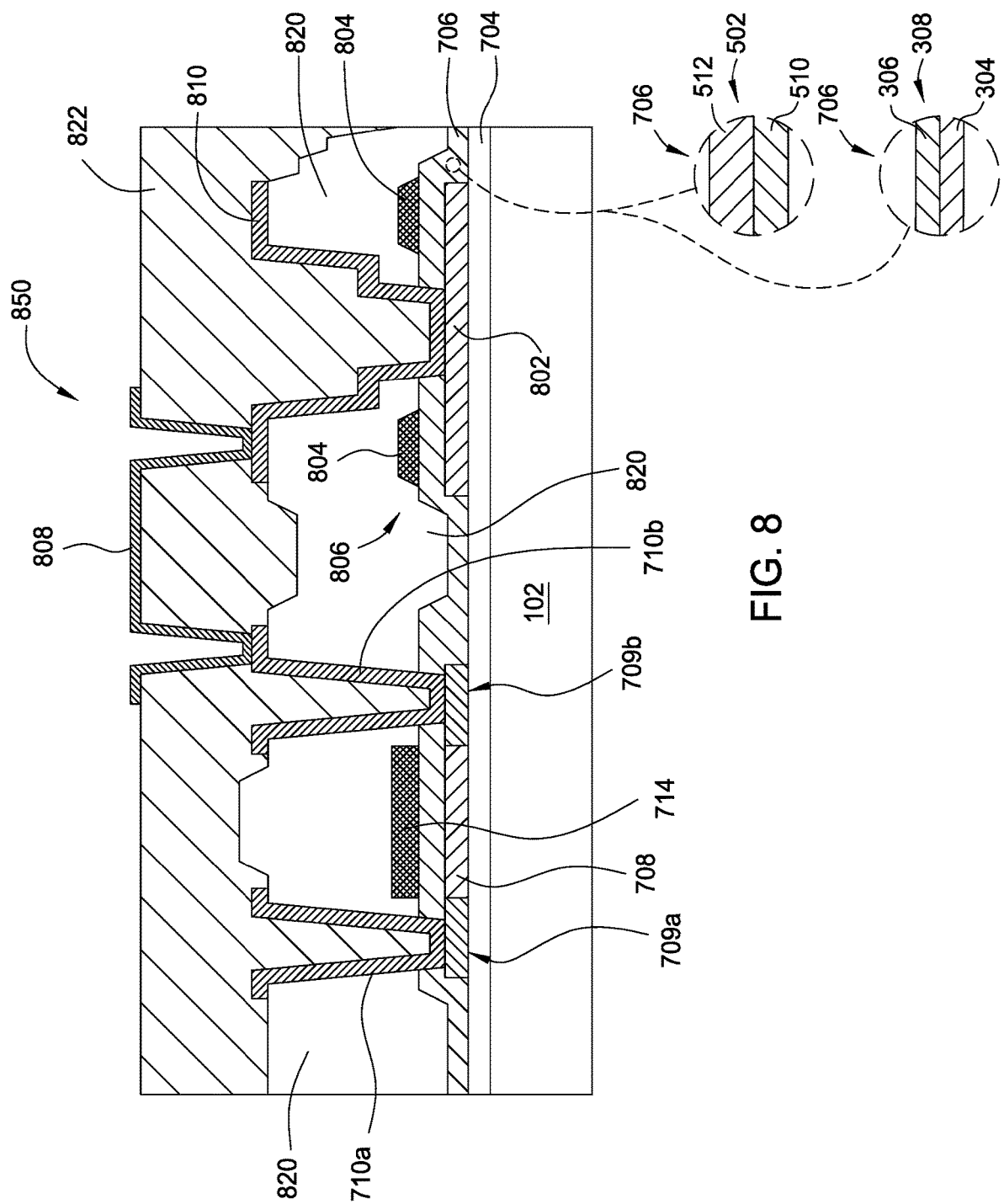
FIG. 8 is a sectional view of one example of a display device structure with a capacitor structure having a composite film layer with high dielectric constant formed therein.

FIG. 8 depicts yet another example of a TFT device structure 850. Similar to the structure described above, the device structure 850 includes a regular interlayer insulator 820 disposed on the gate electrode 714. A passivation layer 822 may be formed on the interlayer insulator 820. Another portion of the source and drain region 802 (electrically connected to the source and drain region 709a, 709b) is shown on the optional insulating layer 704. Another portion of the source-drain metal electrode layer 810 (electrically connected to the source-drain metal electrode layer 710a, 710b) is disposed on and electrically coupled to the source and drain region 802. A pixel electrode 808 may be electrically connected to the source-drain metal electrode layer 810, 710a, 710b. In this particular example, a portion of the gate insulating layer 706 passes through and between the gate electrode 714 and the channel region 708, extending to the area above the source and drain region 802. In one example, the gate insulating layer 706 may be the composite film layer 502 having the first layer 510 and the second layer 512 formed using the process 400 described above with referenced to FIG. 4, or the high dielectric constant material layer 308 in FIG. 3A-3C formed by the process 200 of FIG. 2. An additional electrode 804 is formed above the source and drain region 802 and the gate insulating layer 706, forming a capacitor structure 806 in the device structure 850. The additional electrode 804 formed on the gate insulating layer 706 (now also serves as a capacitor layer) may be electrically connected to the gate electrode 714. Thus, the additional electrode 804 and the source and drain region 802 along with the gate insulating layer 706 formed therebetween form the capacitor structure 806 in the device structure 850. Similarly, the gate insulating layer 706, now also serves as a capacitor layer, may be in form of any of the layers as needed.

It is noted that the source-drain metal electrode layer 710a, 710b, 810, the pixel electrode 808, the common electrode, the gate electrode 714, the upper electrode 710, the lower electrode 707, the top electrode 604, the bottom electrode 602, additional electrode 804 and any electrodes in the device structures may be any suitable metallic materials, including transparent conductive oxide layer (such as ITO or the like), silver nano ink, carbon nano tube (CNT), silver nano ink and CNT, graphene, aluminum (Al), tungsten (W), chromium (Cr), tantalum (Ta), molybdenum (Mo), copper (Cu), TiN, $MoO_2$, $MoN_x$, combination thereof or other suitable materials.

It is noted that the structures above the passivation layer 822 in FIG. 8 or the planarization layer 735 in FIGS. 7A-7B are eliminated for sake of brevity. However, in some exemplary device structures, an additional OLED or LCD devices, or other suitable devices may be formed above the passivation layer 822 or the planarization layer 735 to form other suitable flexible mobile display devices, such as LTPS OLED display devices with touch screen panels as needed.

Thus, the methods described herein advantageously improve the electron stability, electrical performance, low leakage and good film stack integration of display device structures by controlling the materials, particular a high-k material comprising $ZrO_2$ with aluminum dopants formed by either an ALD or PE-ALD process or a composite film layer having a first portion of a high-k material comprising $ZrO_2$ layer and a second portion of a high-k material comprising $ZrO_2$ with aluminum dopants formed by either an ALD or PE-ALD process, and structures of a gate insulating layer, capacitor layer, interlayer insulator, passivation layer, insulating materials in the display devices, along with a dielectric layer formed as a capacitor in the display devices with desired high electrical performance.

While the foregoing is directed to embodiments of the present disclosure, other and further embodiments of the disclosure may be devised without departing from the basic scope thereof, and the scope thereof is determined by the claims that follow.

What is claimed is:

1. A thin film transistor structure comprising:
   a dielectric layer formed on a substrate, wherein the dielectric layer comprises a first layer formed by an amorphous zirconium containing material doped with aluminum and a second layer formed by a crystalline zirconium containing material; and
   gate, source, and drain electrodes formed on the substrate, wherein the gate electrode is formed above or below the dielectric layer.

2. The structure of claim 1, wherein the first layer has a dielectric constant between about 15 and 25.

3. The structure of claim 1, wherein the second layer is a $ZrO_2$ layer having a dielectric constant between about 25 and about 50.

4. The structure of claim 1, further comprising:
   a capacitor layer formed on the gate electrode, wherein the capacitor layer is fabricated from a zirconium containing material comprising aluminum or the capacitor layer is a composite film layer having a first portion fabricated from a zirconium containing material comprising aluminum and a second portion fabricated from the zirconium containing material.

5. The structure of claim 4, wherein the dielectric layer or the capacitor layer is formed by an atomic layer deposition process.

6. The structure of claim 1, wherein:
   the first is aluminum doped $ZrO_2$;
   the first layer is formed by an ALD process or a PE-ALD process; or
   the first layer has an aluminum concentration between about 6 atm % and about 20 atm %.

7. The structure of claim 1, wherein the second layer is a $ZrO_2$ layer.

8. The structure of claim 1, wherein the gate electrode is formed above the dielectric layer.

9. The structure of claim 1, wherein the second layer has a dielectric constant greater than the first layer.

* * * * *

UNITED STATES PATENT AND TRADEMARK OFFICE
CERTIFICATE OF CORRECTION

PATENT NO. : 11,239,258 B2
APPLICATION NO. : 15/773640
DATED : February 1, 2022
INVENTOR(S) : Xiangxin Rui et al.

It is certified that error appears in the above-identified patent and that said Letters Patent is hereby corrected as shown below:

In the Claims

In Column 18, Line 55, in Claim 6, after "first" insert -- layer --.

Signed and Sealed this
Fifth Day of July, 2022

Katherine Kelly Vidal
*Director of the United States Patent and Trademark Office*